(12) United States Patent
Endo et al.

(10) Patent No.: US 7,259,789 B1
(45) Date of Patent: Aug. 21, 2007

(54) METHOD OF PRODUCING COLOR FILTER FOR SOLID-STATE IMAGING DEVICE

(75) Inventors: Hiroki Endo, Kanagawa (JP); Taichi Natori, Kanagawa (JP); Syunji Horiuchi, Kagoshima (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/272,331

(22) Filed: Mar. 19, 1999

(30) Foreign Application Priority Data

Mar. 30, 1998 (JP) ............................... P10-082366

(51) Int. Cl.
*H04N 5/335* (2006.01)
*H04N 3/14* (2006.01)
*H04N 9/04* (2006.01)
*H04N 9/083* (2006.01)

(52) U.S. Cl. ....................................................... 348/274
(58) Field of Classification Search ................ 348/272, 348/273, 274; 257/291, 294, 436
See application file for complete search history.

(56) References Cited

U.S. PATENT DOCUMENTS

| 4,610,509 A | | 9/1986 | Sorimachi et al. |
| 4,876,167 A | * | 10/1989 | Snow et al. ............ 257/294 |
| 5,140,396 A | * | 8/1992 | Needham et al. ......... 257/294 |
| 5,172,206 A | | 12/1992 | Iizuka |
| 5,805,966 A | * | 9/1998 | Yamada ...................... 399/284 |

FOREIGN PATENT DOCUMENTS

| EP | 0 304 382 | | 2/1989 |
| EP | 726503 A2 | * | 8/1996 |
| WO | WO95/00878 | | 1/1995 |

* cited by examiner

*Primary Examiner*—Vivek Srivastava
*Assistant Examiner*—Justin P Misleh
(74) *Attorney, Agent, or Firm*—Radar Fishman & Grauer PLLC; Ronald P. Kananen

(57) ABSTRACT

A method of producing a color filter composed of filter elements of RGB is used for a solid-state imaging device, which color filter is capable of improving the resolution of the device. The method includes the steps of: forming a filter layer of a second color in a region in which a filter element of a first color is to be formed; and stacking a filter layer of a third color different from the second color on the filter layer of the second color. In the method, the color filter is preferably composed of filter elements of a plurality of the first colors each of which is either of red, green and blue colors. The filter elements are preferably produced by the steps of: forming a yellow filter layer as a filter layer of the second or third color in a region in which the filter elements of red and green colors as the first colors are to be formed; forming a cyan filter layer as a filter layer of the second or third color in a region in which the filter elements of green and blue colors as the first colors are to be formed; and forming a magenta filter layer as a filter layer of the second or third colors in a region in which filter elements of red and blue colors as the first colors are to be formed.

14 Claims, 3 Drawing Sheets

YE PIGMENT

R = – CH2 CH2 CH2 OCH2 CH3

FIG. 2B  CY PIGMENT

R = – CH2 CH2 CH2 OCH2 CH3

MG PIGMENT

R = – CH2 CH2 CH2 OCH2 CH3

METHOD OF PRODUCING COLOR FILTER FOR SOLID-STATE IMAGING DEVICE

BACKGROUND OF THE INVENTION

The present invention relates to a method of producing a color filter for a solid-state imaging device, for example, a CCD (Charged-Coupled Device), and a liquid crystal display device.

Recently, in the production of a color filter on a light receiving sensor portion of a color display solid-state imaging device, a pigment containing photosensitive resin method called a color resist method has come to be adopted in place of a dyeing method.

The color resist method (pigment containing photosensitive resin method) has a large merit from the viewpoint of its production because it does not require a dyeing step.

The above-described color resist method, however, has a disadvantage in the case where a fine color filter to be used, for example, for a solid-state imaging device is formed of filter elements of red (R), green (G), and blue (B) colors. That is to say, in this case, since an exposure amount necessary for patterning these color filter elements becomes significantly large, it is difficult to pattern these filter elements with a high accuracy.

The sensitivity of a color resist is naturally low because the color resist contains a pigment in a large amount. To cope with an inconvenience caused by the low sensitivity of the color resist, a negative resist having a higher sensitivity has been used as the color resist.

For example, as a resist for forming filter elements of red, green and blue (RGB), a pigment dispersion type acrylic negative resist formed by adding a multi-functional acrylic monomer, a photo-polymerization initiator, and a pigment into a binder resin has been generally known and widely available. This resist, if it contains no pigment, has a sensitivity being as large as 100 times or more that of a novolak positive resist (formed by adding a naphthoquinone diazide based a photosensitizer into a novolak resin) which has been applied to fine processing.

However, if a fine color filter for a solid-state imaging device is formed by using the above-described pigment dispersion type acrylic negative resist in which a pigment is dispersed, there may occur a problem that the image quality of the solid-state imaging device is significantly degraded because of the insufficient resolution of the resist, the inversely tapered edge shape of the obtained resist pattern, and color mixing and uneven sensitivity between pixels caused by influence of a residual pigment after development.

Accordingly, it is expected to provide a method of producing a color filter composed of filter elements of RGB and used for a solid-state imaging device, which color filter is capable of improving the resolution of the solid-state imaging device.

SUMMARY OF THE INVENTION

An object of the present invention is to provide a method of producing a color filter composed of filter elements of RGB and used for a solid-state imaging device, which color filter is capable of improving the resolution of the device.

To achieve the above object, according to the present invention, there is provided a method of producing a color filter, including the steps of: forming a filter layer of a second color in a region in which a filter element of a first color is to be formed; and stacking a filter layer of a third color different from the second color on the filter layer of the second color. In the above method, the color filter is preferably composed of filter elements of a plurality of the first colors each of which is either of red, green and blue colors; and the filter elements of the plurality of the first colors are preferably produced by the steps of: forming a yellow filter layer as a filter layer of the second or third color in a region in which the filter elements of red and green colors as the first colors are to be formed; forming a cyan filter layer as a filter layer of the second or third color in a region in which the filter elements of green and blue colors as the first colors are to be formed; and forming a magenta filter layer as a filter layer of the second or third colors in a region in which filter elements of red and blue colors as the first colors are to be formed.

As compared with each of filter layers of RGB, each of the yellow filter layer (YE layer), cyan filter layer (CY layer), and magenta filter layer (MG layer) is smaller in absorption of visible light, and therefore, it can be made from a resist containing a pigment in a smaller amount.

As a result, the producing method of the present invention exhibits the following advantage. That is to say, each of the filter elements of RGB is formed by stacking of the associated two layers selected from the CY layer, MG layer and YE layer each of which is made from a resist containing a pigment in a reduced amount as described above, so that each of the filter elements of RGB can be produced with the exposure amount set at a practical value because the reduction ratio of the sensitivity of the resist due to addition of the pigment becomes small.

BRIEF DESCRIPTION OF THE DRAWINGS

A method of producing a color filter according to the present invention is illustrated schematically in the accompanying drawings in which:

FIGS. 2A to 2C are diagrams showing chemical structures of pigments used for a color filter prepared in an inventive example.

DETAILED DESCRIPTION OF THE PREFERRED EMBODIMENT

Hereinafter, one embodiment of a method of producing a color filter for a solid-state imaging device according to the present invention will be described with reference to FIGS. 1A to 1C.

Figure 1A:
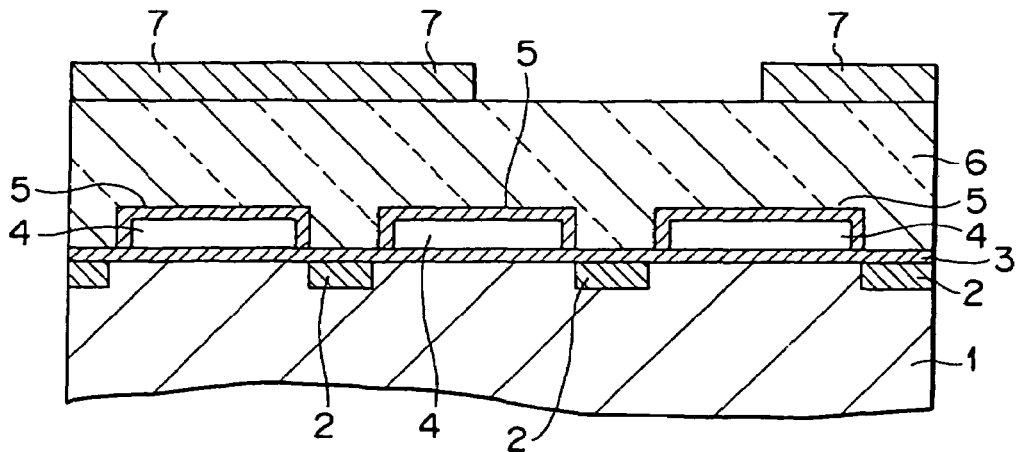
FIGS. 1A to 1C are side sectional views of essential portions of a color filter structure for illustrating the steps of producing a color filter in accordance with one embodiment of the present invention.

First, as shown in FIG. 1A, there is prepared a silicon substrate 1 which has been processed to a state before formation of a color filter. In the silicon substrate 1, light receiving sensor portions 2 for photo-electric conversion have been formed in a surface layer portion, vertical transfer electrodes 4 made from polysilicon have been formed on the silicon substrate 1 via an oxide film 3, light shield films 5 have been formed in such a manner as to cover the vertical transfer electrodes 4, and an interlayer insulating film 6 has been formed in such a manner as to cover the vertical transfer electrodes 4 and the light shield films 5.

Then, as shown in FIG. 1A, a yellow filter layer (hereinafter, referred to as "YE layer") 7 is formed on the interlayer insulating film 6 formed on the silicon substrate 1 at positions where a red color filter element and a green color filter element are to be formed.

The YE layer 7 is made from a positive photoresist into which a dye is added. The positive photoresist may be preferably obtained by adding a naphthoquinone diazide based a photosensitizer into a resin soluble in an aqueous alkali solution, for example, a novolak resin, polyhydroxystyrene resin, or acrylic resin in which a carboxylic acid group is introduced.

The dye added into such a positive photoresist may be selected from those composed of pigments each having a good compatibility with the positive photoresist, and concretely, it may be selected from an oil soluble dye, a dispersion dye, an acidic dye, and the like. In particular, from the viewpoint of the compatibility and heat resistance, there may be preferably used a dye composed of a pigment having

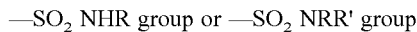

where R and R' are an alkyl group or a group derived therefrom and an allyl group and a group derived therefrom, respectively.

According to the present invention, in order that the spectral characteristics of the red color filter element and green color filter element have a preferable balance in terms of color reproduction, it may be desirable that a principal pigment contained in a material for forming the YE layer 7 be an azo pigment. It should be noted that in this specification, the principal pigment is defined as a pigment accounts for 50 wt % or more of the total amount of pigments added in a resist.

The YE layer 7 is formed into a pattern having a specific shape at a desired position by a known resist method or lithography method including the steps of coating, exposure and development of a color resist.

Figure 1B:
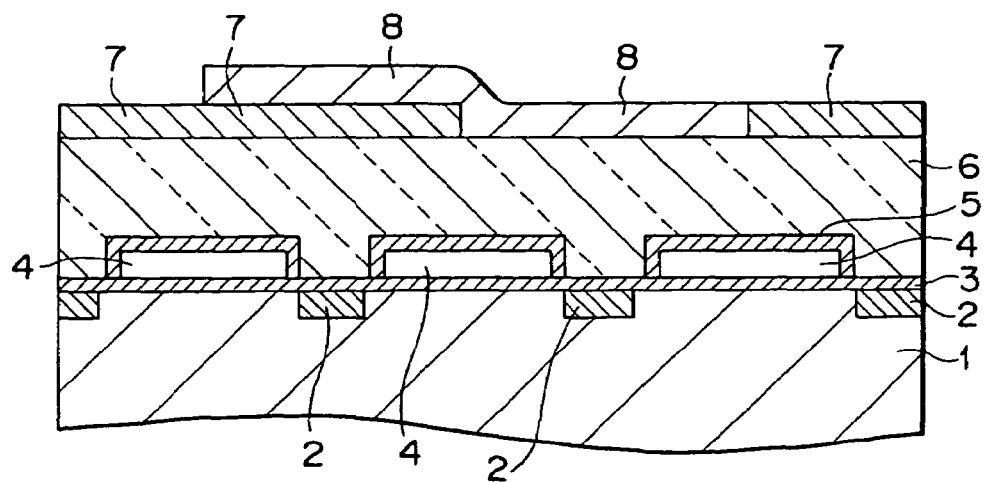

After formation of the YE layer 7, as shown in FIG. 1B, a cyan filter layer (CY layer) 8 is formed at positions where the green color filter element and a blue color filter element are to be formed in accordance with the same manner as that for forming the YE layer 7.

Like the YE layer 7, the CY layer 8 is made from a positive photoresist into which a dye is added. Also, as described for the YE layer 7, the dye added into the positive photoresist for forming the CY layer 8 may be selected from those composed of pigments each having a good compatibility with the positive photoresist.

With respect to the CY layer 8, in order that the spectral characteristics of the green color filter element and blue color filter element have a preferable balance in terms of color reproduction, it may be desirable that a principal pigment contained in a material for forming the CY layer 8 be a copper phthalocyanine pigment.

Like the YE layer 7, the CY layer 8 is formed into a pattern having a specific shape at a desired position by the known resist method or lithography method including the steps of coating, exposure and development of a color resist.

Figure 1C:
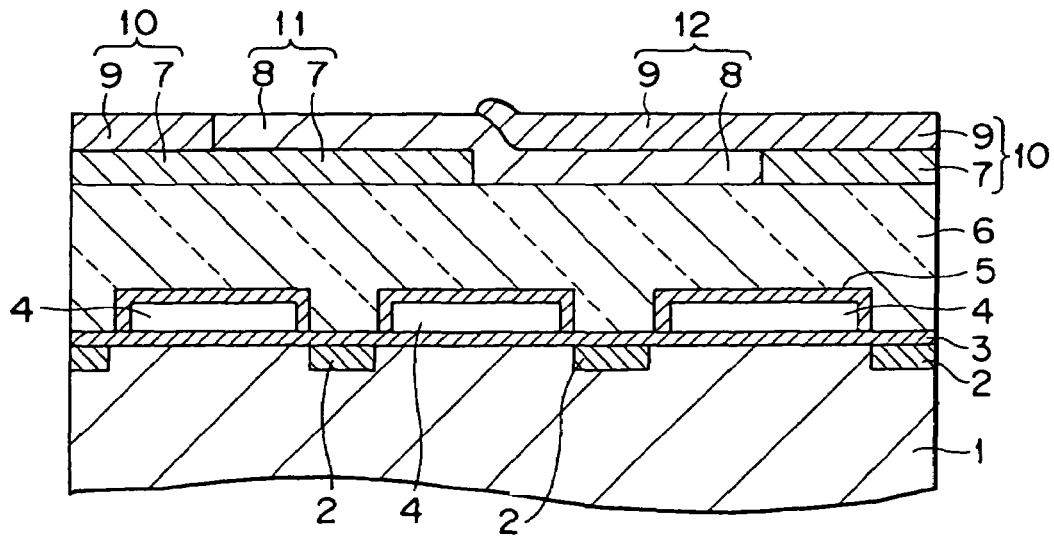

As shown in FIG. 1C, a magenta filter layer (MG layer) 9 is then formed at positions where the red color filter element and blue color filter element are to be formed in accordance with the same manner as that for forming the YE layer 7 and CY layer 8.

Like the YE layer 7 and CY layer 8, the MG layer 9 is made from a positive photoresist into which a dye is added. The dye added into the positive photoresist for forming the MG layer 9 may be similarly selected from those composed of pigments each having a good compatibility with the positive photoresist.

With respect to the MG layer 9, in order that the spectral characteristics of the red color filter element and blue color filter element have a preferable balance in terms of color reproduction, it may be desirable that a principal pigment contained in a material for forming the MG layer 9 be a xanthene pigment.

Like the YE layer 7 and CY layer 8, the MG layer 9 is formed into a pattern having a specific shape at a desired position by the known resist method or lithography method including the steps of coating, exposure and development of a color resist.

By forming the YE layer 7, CY layer 8 and MG layer 9 as described above, the YE layer 7 and MG layer 9 are stacked at the position where the red color filter element is to be formed, the YE layer 7 and CY layer 8 are stacked at the position where the green color filter element is to be formed, and the CY layer 8 and MG layer 9 are stacked at the position where the blue color filter element is to be formed. Consequently, each of the filter elements of RGB is formed by the stacked structure of the associated two of the above YE layer 7, CY layer 8 and MG layer 9. To be more specific, a red color filter element 10 is formed by the stacked structure of the YE layer 7 and MG layer 9, a green color filter element 11 is formed by the stacked structure of the YE layer 7 and CY layer 8, and a blue color filter element 12 is formed by the stacked structure of the CY layer 8 and MG layer 9.

After formation of the filter elements of RGB, a protective film and a microlens are formed thereon as needed, to obtain a solid-state imaging device.

Each of the red color filter element 10, green color filter element 11, and blue color filter element 12 is made small in the reduction ratio of the sensitivity of the resist due to addition of the pigment and is therefore allowed to be patterned with the exposure amount set at a practical value, because each of the filter layers 7, 8 and 9 constituting the filter elements 10, 11 and 12 is small in absorption of visible light and is therefore made from the positive photoresist containing the pigment in a small amount. As a result, each of the red color filter element 10, green color filter element 11 and blue color filter element 12 is highly accurately formed by the stacked structure of the associated two of the above-described filter layers into a desired pattern even if such a pattern has fine geometries, and therefore, a solid-state imaging device having such a color filter can exhibit a favorable image quality with less defect as compared with the related art device.

In the above embodiment, the filter layers are formed in the order of the YE layer 7, CY layer 8 and MG layer 9; however, the present invention is not limited to the formation order. That is to say, any one of the YE layer 7, CY layer 8 and MG layer 9 may be formed in preference to the others.

The present invention will be more clearly understood with reference to the following example:

EXAMPLE

A color filter composed of a red color filter element, green color filter element and blue color filter element was produced in accordance with the following procedure.

A silicon substrate in which necessary elements were previously formed was prepared. Then, a resist for forming a YE filter layer was applied on an interlayer insulating film previously formed on the silicon substrate by spin-coating, and was sequentially subjected to removal of a solvent by pre-baking, pattern exposure by an i-ray stepper, and development with an aqueous TMAH (Tetramethylammonium Hydroxide) solution, to thereby obtain a resist pattern.

The entire surface of the silicon substrate was then subjected to exposure by the i-ray stepper to bleach a photosensitizer contained in the resist for forming the YE filter layer, and the resist pattern was hardened by post-baking.

In this way, a YE filter layer (YE layer) was formed at positions where a red color filter element and a green color filter element were to be formed.

A resist for forming a CY filter layer was applied on the silicon substrate by spin-coating, to form a CY filter layer (CY layer) at positions where the green color filter element and a blue color filter element were to be formed in the same manner as that for forming the YE filter layer.

A resist for forming a MG filter layer was applied on the silicon substrate by spin-coating, to form a MG filter layer (MG layer) at positions where the red color filter element and the blue color filter element were to be formed in the same manner as that for forming the YE filter layer and CY filter layer.

In this way, a red color filter element was formed by the stacked structure of the YE layer and MG layer, a green color filter element was formed by the stacked structure of the YE layer and CY layer, and a blue color filter element was formed by the stacked structure of the MG layer and CY layer.

Figure 2A:
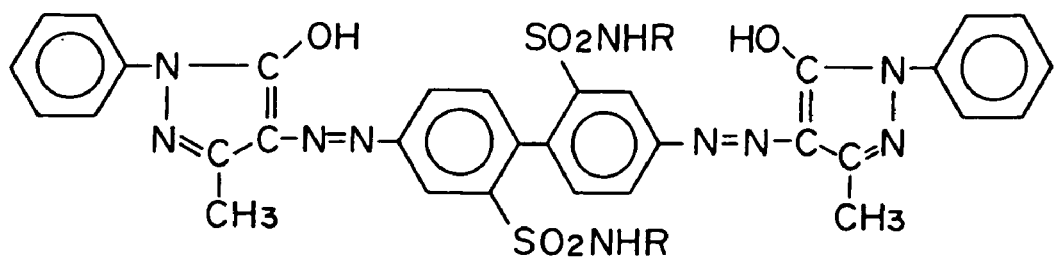
Figure 2A:
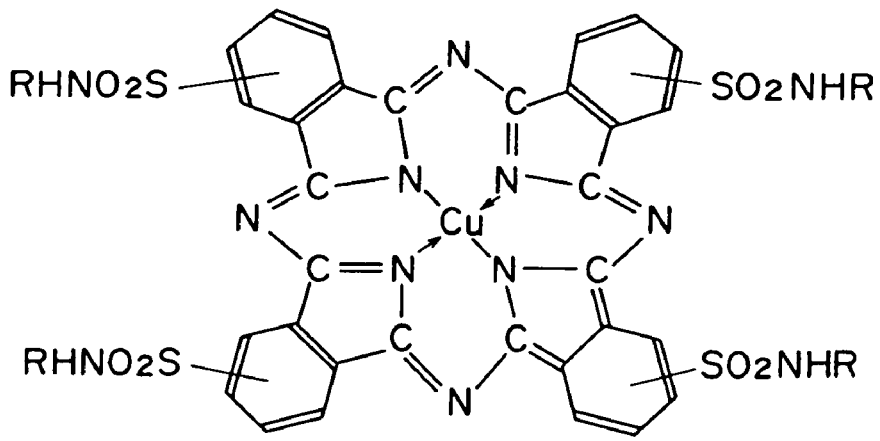
Figure 2C:
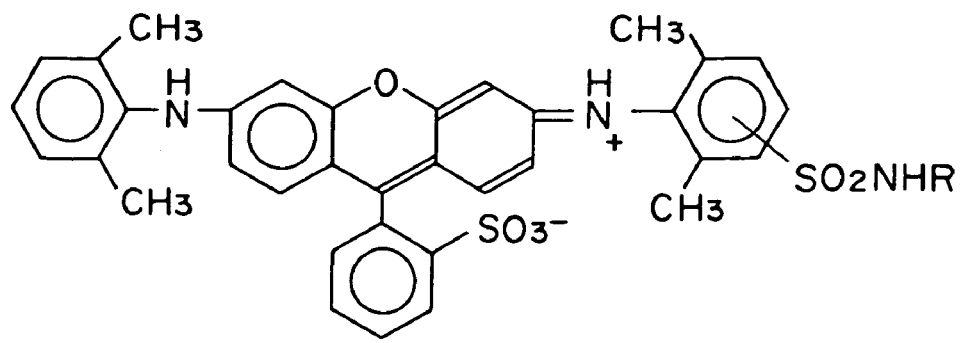

Here, the resists for forming the YE filter layer, CY filter layer and MG filter layer are as follows:

(1) novolak positive resist [trade name: HPR204ES-Z (23CP), sold by Fuji Film Olin Kabushiki Kaisha]
  100 parts by weight
(2) thermosetting agent (hexamethoxymethylmelamine)
  1 part by weight
(3) pigment dissolution assistant
  (Dmf; Dimethylformamide)
  20 parts by weight
(4) pigment (*) 8 parts by weight (*) The pigment used for the resist for forming the YE filter layer has a chemical structure shown in FIG. 2A, the pigment used for the resist for forming the CY filter layer has a chemical structure shown in FIG. 2B, and the pigment used for the resist for forming the MG filter layer has a chemical structure shown in FIG. 2C.

A spectral sensitivity of a solid-state imaging device having the color filter thus obtained was measured. The measurement result is shown in FIG. 3.

Figure 3:
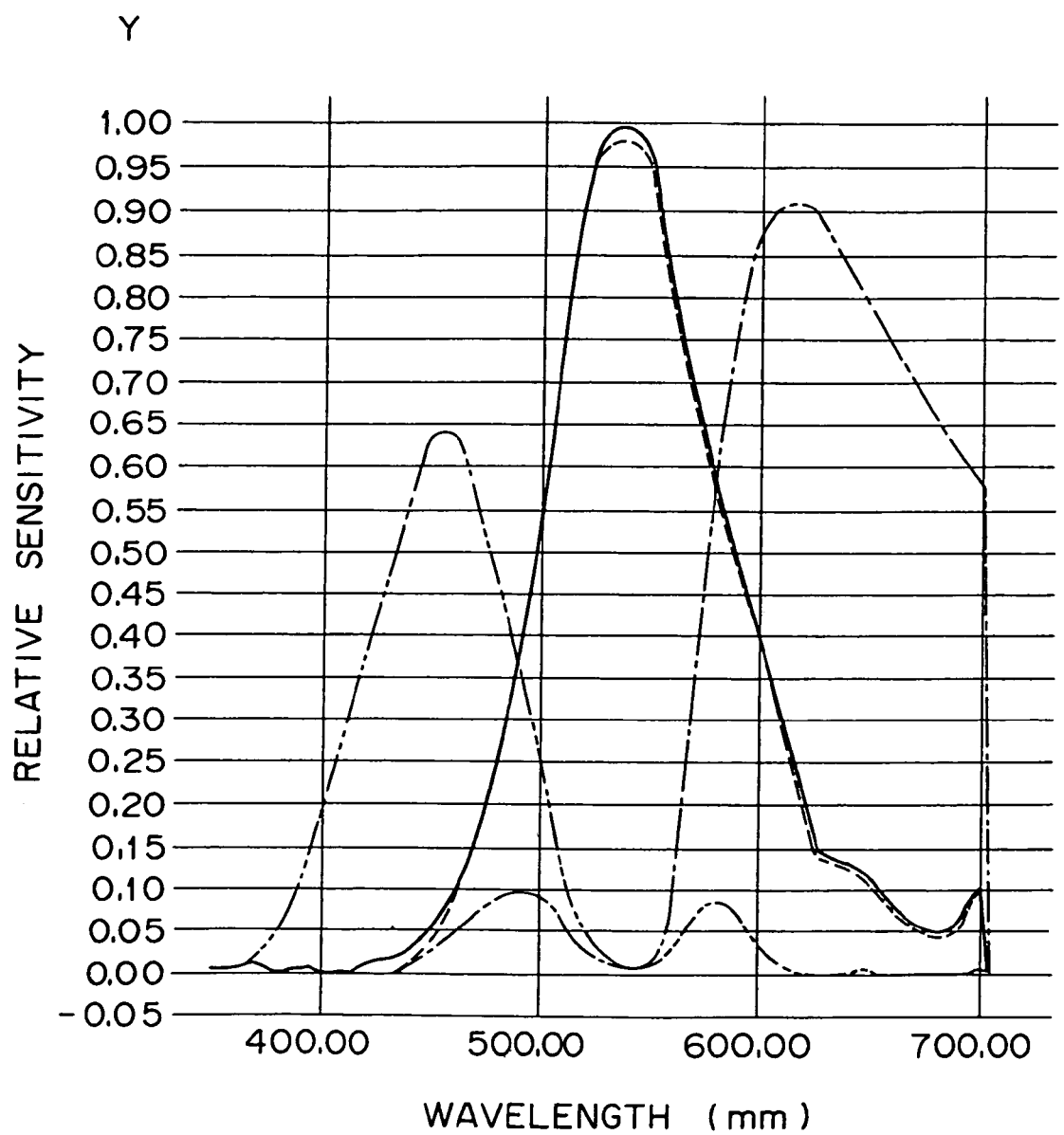
FIG. 3 is a diagram showing a result of measuring a spectral sensitivity of a solid-state imaging device having a color filter obtained in accordance with the producing method of the present invention.

As shown in FIG. 3, it is confirmed that the color filter obtained in accordance with the producing method of the present invention has a favorable spectral sensitivity characteristic.

As described above, the method of producing a color filter for a solid-state imaging device according to the present invention is characterized in that each of the filter elements of RGB constituting the color filter is formed by the stacked structure of the associated two of a yellow filter layer, a cyan filter layer and a magenta filter layer each of which is smaller in absorption of visible light than a single layer directly forming each of the filter elements of RGB and which is therefore allowed to be made from a resist containing a pigment in a smaller amount. Accordingly, even if using a positive photoresist, each of the filter elements of RGB can be patterned with the exposure amount set at a practical value because the reduction ratio of the sensitivity of each color resist due to addition of the pigment becomes small.

As a result, each of the red color filter element, green color filter element and blue color filter element is highly accurately formed by the stacked structure of the associated two of the above-described filter layers into a desired pattern even if such a pattern has fine geometries, and therefore, a solid-state imaging device having such a color filter can exhibit a favorable image quality with less defect as compared with the related art device.

While the preferred embodiment has been described using the specific terms, such description is for illustrative purposes only, and it is to be understood that changes and variations may be made without departing from the spirit or scope of the following claims.

What is claimed is:

1. A method of producing a color filter, comprising the steps of:
    forming a filter layer of a second color in a substrate region in which a filter element of a first color is to be formed; and
    overlapping a filter layer of a third color different from said second color on said filter layer of said second color and on said substrate;
    wherein two overlapping filter layers form the filter element,
    wherein said filter layer of a third color is made from a dye containing photoresist, and
    wherein each of said filter layers of said second color is made from a dye containing positive photoresist.

2. A method of producing a color filter according to claim 1, wherein said first color is a primary color, and each of said second and third colors is a complementary color.

3. A method of producing a color filter according to claim 1, wherein said color filter is composed of filter elements of a plurality of said first colors each of which is either of red, green and blue colors; and
    wherein said filter elements of said plurality of said first colors are produced by the steps of:
        forming a yellow filter layer as a filter layer of said second or third color in a region in which said filter elements of red and green colors as said first colors are to be formed;
        forming a cyan filter layer as a filter layer of said second or third color in a region in which said filter elements of green and blue colors as said first colors are to be formed; and
        forming a magenta filter layer as a filter layer of said second or third colors in a region in which filter elements of red and blue colors as said first colors are to be formed.

4. A method of producing a color filter according to claim 3, wherein a principal pigment contained in a material for forming said yellow filter layer is an azo pigment;
    a principal pigment contained in a material for forming said cyan filter layer is a copper phthalocyanine pigment; and
    a principal pigment contained in a material for forming said magenta filter layer is a xanthene pigment.

5. A color filter comprising:
    the color filter made by the method of claim 1,
    wherein the second color layer is in the same row as the third color layer and in a row above the third color layer.

6. A color filter according to claim 5, wherein said first color is a primary color, and each of said second and third colors is a complementary color.

7. A color filter according to claim 5, wherein said first color is red, and said second and third colors are yellow and magenta respectively.

8. A color filter according to claim 5, wherein said first color is green, and said second and third colors are yellow and cyan respectively.

9. A color filter according to claim 5, wherein said first color is blue, and said second and third colors are cyan and magenta respectively.

10. A solid-state imaging device comprising:
   a plurality of light receiving sensor portions for photo-electric conversion, provided in a surface layer portion of a substrate; and
   the color filter made by the method of claim 1 provided correspondingly to said plurality of light receiving sensor portions.

11. A solid-state imaging device according to claim 10, wherein said first color is a primary color, and each of said second and third colors is a complementary color.

12. A solid-state imaging device according to claim 10, wherein said first color is red, and said second and third colors are yellow and magenta respectively.

13. A solid-state imaging device according to claim 10, wherein said first color is green, and said second and third colors are yellow and cyan respectively.

14. A solid-state imaging device according to claim 10, wherein said first color is blue, and said second and third colors are cyan and magenta respectively.

* * * * *